US006921276B2

(12) United States Patent  
McClinton

(10) Patent No.: US 6,921,276 B2
(45) Date of Patent: Jul. 26, 2005

(54) POSITION INDICATOR FOR ELECTRICAL CONNECTOR

(75) Inventor: Jeffrey Byron McClinton, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 73 days.

(21) Appl. No.: 10/113,540

(22) Filed: Apr. 1, 2002

(65) Prior Publication Data

US 2003/0186578 A1 Oct. 2, 2003

(51) Int. Cl.⁷ .............................................. H01R 13/625
(52) U.S. Cl. ....................................................... 439/342
(58) Field of Search ................................ 439/342, 259, 439/265, 263, 268, 270, 266, 426, 429, 260, 261, 262, 264

(56) References Cited

U.S. PATENT DOCUMENTS

| 6,071,140 A | * | 6/2000 | McHugh et al. | ............ 439/342 |
| 6,116,936 A | | 9/2000 | Pei | |
| 6,146,178 A | | 11/2000 | Walkup et al. | |
| 6,231,366 B1 | | 5/2001 | Pei et al. | |
| 6,338,646 B1 | | 1/2002 | Hara et al. | |
| 6,450,825 B1 | * | 9/2002 | Huang | ........................ 439/342 |
| 6,450,827 B1 | * | 9/2002 | Huang | ........................ 439/342 |

FOREIGN PATENT DOCUMENTS

EP  0 335 093 A2  2/1989

* cited by examiner

*Primary Examiner*—Alexander Gilman

(57) ABSTRACT

A socket for an electrical package is provided. The socket includes a cover and base housing that are slidably engaged with one another. The cover includes an array of holes configured to receive pins from an electrical package, and the base includes a corresponding array of cavities. The socket includes a cam assembly that moves the base and cover between open and closed positions. The cam assembly includes an indicator that moves between first and second indicator positions corresponding to the open and closed positions of the socket. Optionally, the indicator extends outward beyond a front end of the socket when the socket is in the closed position.

29 Claims, 7 Drawing Sheets

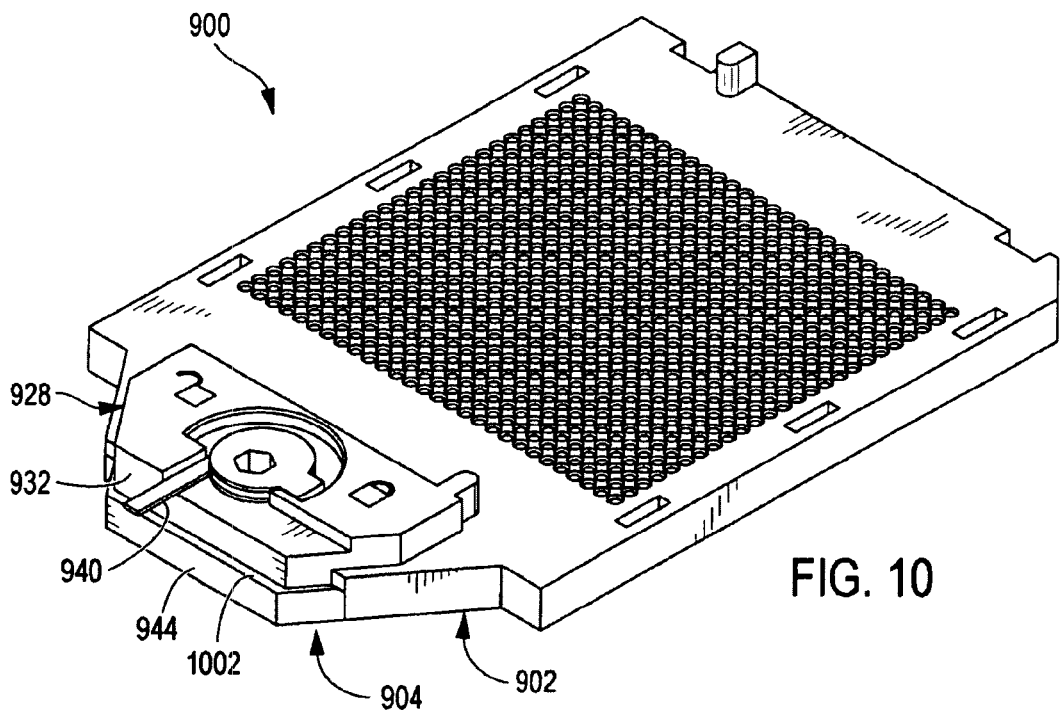
FIG. 10
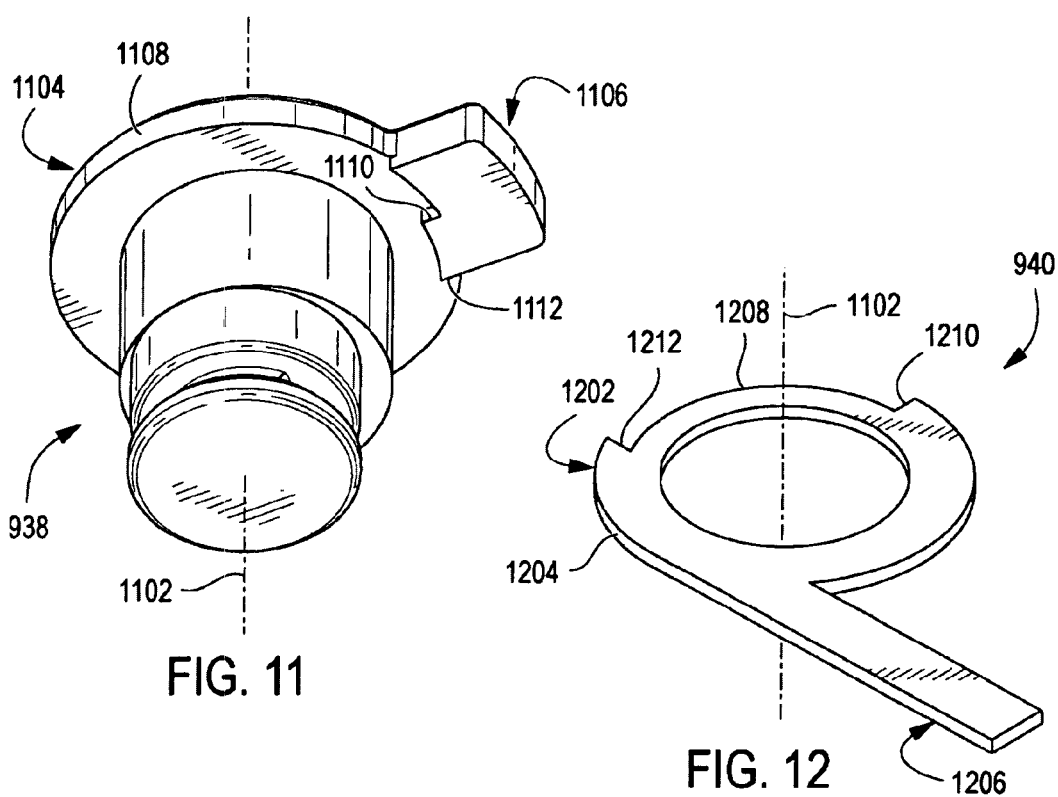
FIG. 11
FIG. 12

POSITION INDICATOR FOR ELECTRICAL CONNECTOR

BACKGROUND OF THE INVENTION

Certain embodiments of the present invention generally relate to electrical sockets, such as pin grid array (PGA) sockets. More specifically, certain embodiments of the present invention generally relate to zero insertion force (ZIF) sockets having position indicators.

Heretofore, electrical sockets have been proposed that are used to open and close circuits between electrical components, such as processors, and printed circuit boards (PCBs) to which the sockets are connected. The sockets typically include a base having a cover slidably mounted thereon. The sliding motion between the base and cover is controlled in numerous manners in conventional sockets. For example, U.S. Pat. No. 6,146,178 discloses a ZIF connector with a cam mechanism that has a slot for receiving a flathead screwdriver. The cam mechanism can be moved by a flathead screwdriver between two cam positions corresponding to open and closed positions of the connector. One of two cone-shaped depressions spaced at 90 degrees from one another on the cam mechanism receives a semi-spherical bulge protruding from a base when the connector is in one of open and closed positions. Movement of the cam mechanism from either of the two cam positions is restricted, thus retaining the position (open or closed) of the connector in the absence of sufficient force on the cam mechanism. Engagement of the semi-spherical bulge to one of the two cone-shaped depressions signifies that the socket is in one of open and closed positions, and retains the socket in the same.

U.S. Pat. No. 6,116,936 ('936 patent) discloses a similar cam mechanism for a connector. The cam mechanism in the '936 patent includes two indentations along a circular perimeter spaced at 90 degrees from one another. One of the two indentations engages with a spire in a spring when the cam mechanism and connector are in one of open and closed positions. Engagement of the spire to one of the two indentations signifies that the socket is in one of open and closed positions, and retains the socket in the same.

However, it is difficult to easily determine whether an electrical socket is in an open or closed position. For instance, a processor often is mounted onto a ZIF PGA socket that is mounted onto a printed circuit board (PCB). Because the ZIF PGA socket is sandwiched between a processor and a PCB, visual inspection of the cam mechanism, to determine whether the ZIF PGA socket is open or closed, is difficult. Moreover, an entire assembly of a processor, ZIF PGA socket, and a PCB may be encased in a housing that further impedes visual inspection. The position of the socket is not determinable by simple inspection since the cam mechanism is hidden from view. Consequently, a tool, such as a flathead screwdriver or hexagonal wrench, must be inserted into the cam mechanism and turned to identify the socket position. Insertion of the tool simply to identify the cam position is time consuming and not desirable.

A need remains for a socket that more adequately identifies between open and closed positions.

BRIEF SUMMARY OF THE INVENTION

An embodiment of the present invention provides a socket for an electrical package. The socket includes a cover and base housing that slidably engage one another. The cover includes an array of holes configured to receive pins from an electrical package, and the base includes a corresponding array of cavities. The socket includes a cam assembly that moves the base and cover between open and closed positions. The socket further includes an indicator that pivotally moves between first and second indicator positions relative to the base. Optionally, the indicator extends outward beyond a front end of the socket when the socket is in the closed position. The indicator may rotate between a different range of rotation than the drive element when the socket is moved between open and closed positions. Optionally, the indicator may rotate 90 degrees while the drive element rotates 180 degrees.

The cam assembly may include a circular base portion rotationally held in a circular hole of the base and a circular cam portion rotationally held in an oval hole in the cover. The cam assembly may drive an arm of the indicator between the first and second indicator positions. Optionally, the cam assembly may include a body section with a tab extending outward radially therefrom. The tab engages and drives or activates the indicator between the first and second indicator positions. The indicator enables a user to easily identify the status of the cover relative to the base. Optionally, the tab can rotate through a camming range that is different than the range of rotation through which the indicator moves. The tab may engage the indicator at the beginning, an intermediate point, or end of the camming range. The tab may engage the indicator at one of two points on the indicator. Optionally, the indicator may include fingers at which the tab engages the indicator. Alternatively, the cam assembly may include a ring-shaped body section with an arcuate notch in which the tab may move and engage ends of the arcuate notch.

Alternatively, the cover may include an indicator that is biased inward toward the cam assembly in a first position and flexed outward by the cam assembly in a second position.

An advantage of certain embodiments of the present invention is that the open and closed positions of the socket can easily be identified even when a processor is mounted onto the socket and the socket is mounted onto a PCB.

These and other features and embodiments of the present invention are discussed or apparent in the following detailed description of certain embodiments of the present invention.

BRIEF DESCRIPTION OF SEVERAL VIEWS OF THE DRAWINGS

FIG. 10 illustrates top front perspective view of a socket assembly in a closed position formed in accordance with an embodiment of the present invention.

FIG. 11 illustrates a bottom perspective view of a cam pin formed in accordance with an embodiment of the present invention.

FIG. 12 illustrates a top perspective view of an indicator formed in accordance with an embodiment of the present invention.

Figure 1:
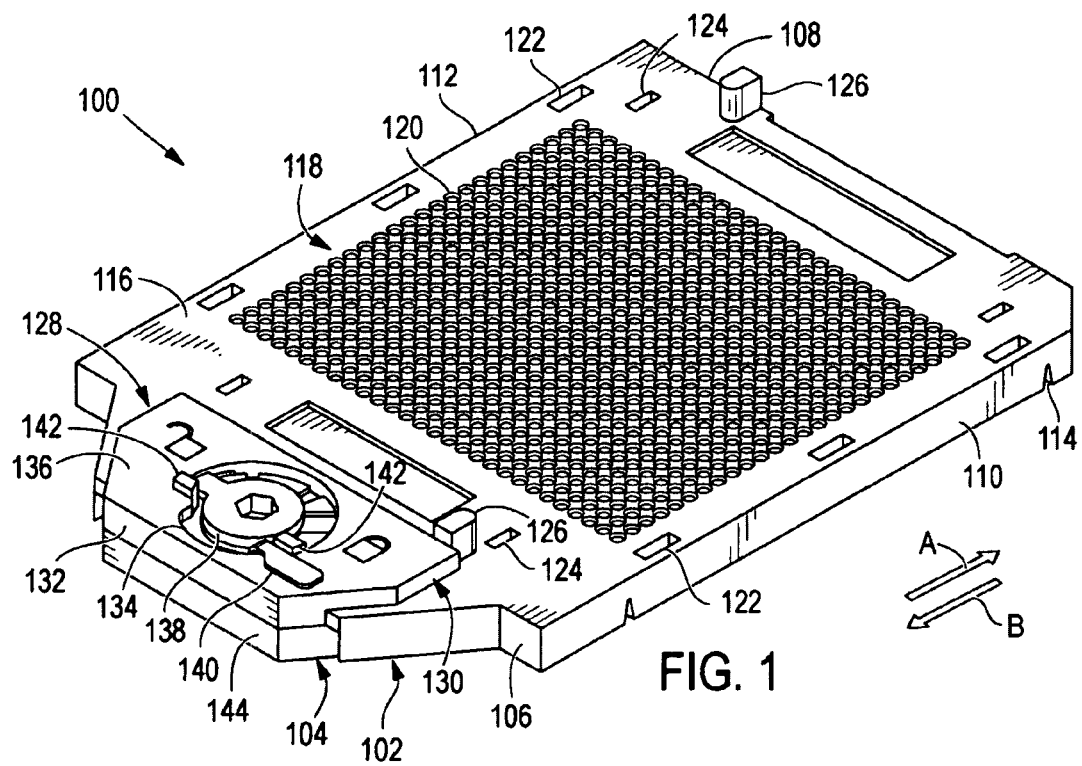
FIG. 1 illustrates a top front perspective view of a socket assembly in an open position formed in accordance with an embodiment of the present invention.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentality shown in the attached drawings.

DETAILED DESCRIPTION OF THE INVENTION

FIG. 1 illustrates a zero insertion force (ZIF) pin grid array (PGA) socket assembly 100 in an open position formed in accordance with an embodiment of the present invention. The socket assembly 100 includes a cover 102 and a base 104 that slidably move relative to one another along directions denoted by arrows A and B. The cover 102 includes front and back ends 106 and 108 as well as sides 110 and 112. The sides 110 and 112 include notches 114 for relieving stress within, and preventing warping of, the cover 102 during formation. The cover 102 includes a top surface 116 that has a PGA 118 having a plurality of holes 120 for receiving pins from a processor (not shown). The top surface 116 includes mold bypass holes 122 proximate the sides 110 and 112 and mold bypass holes 124 proximate the front and back ends 106 and 108. The mold bypass holes 122 and 124 are for manufacturing purposes. The top surface 116 also includes polarization posts 126 protruding upward therefrom and proximate the front and back ends 106 and 108.

The cover 102 includes a cam assembly 128 proximate the front end 106 and elevated a step 130 from the top surface 116 of the cover 102. The cam assembly 128 serves as an activator mechanism to engage the base 104 and cover 102. The cam assembly 128 includes a front end 132 and a cam pin retention hole 134 cut into a top surface 136 of the cam assembly 128. The cam pin retention hole 134 includes a cam pin 138 and an indicator 140 housed therein and stopping posts 142 for stopping rotation of the cam pin 138. The indicator 140 serves as a visual indicator that is seen when movement of the cover 102 relative to the base 104 occurs. In the open position (FIG. 1), the pins of the processor are disconnected from the contacts. In the open position, the front end 132 of the cam assembly 128 and a front end 144 of the base 104 are coplanar, and the indicator 140 does not extend beyond the front ends 132 and 144 of the cam assembly 128 and the base 104, respectively.

Figure 2:
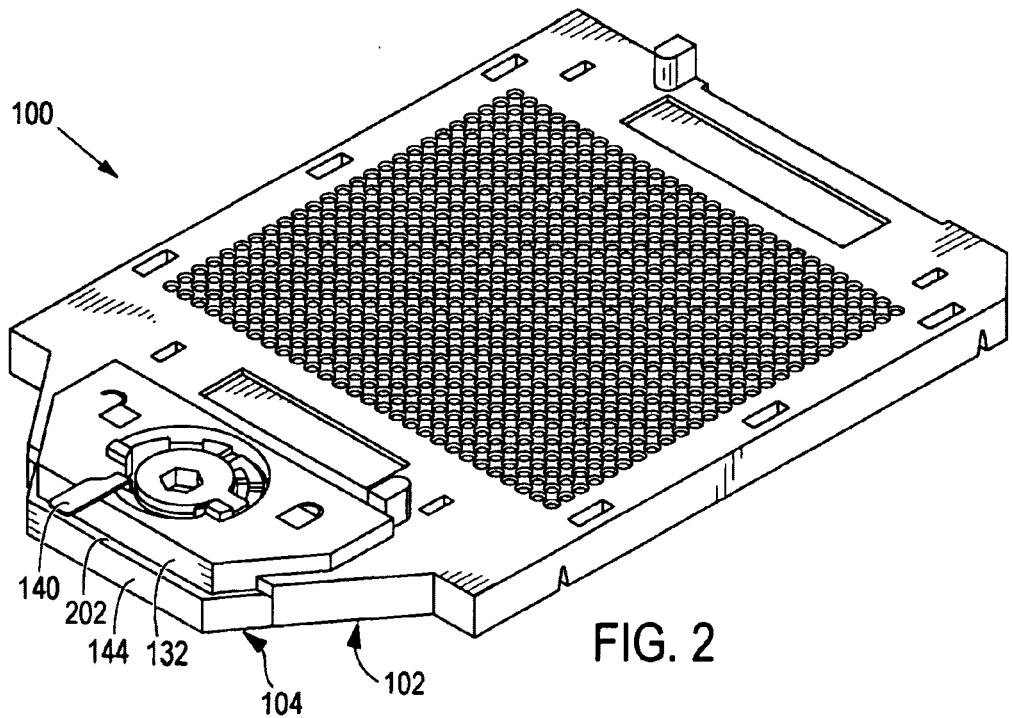
FIG. 2 illustrates a top front perspective view of a socket assembly in a closed position formed in accordance with an embodiment of the present invention.

FIG. 2 illustrates the socket assembly 100 in a closed position formed in accordance with an embodiment of the present invention. When in the closed position, the pins of the processor are connected to the contacts. The cover 102 and base 104 are shifted so that the front end 132 of the cam assembly 128 and the front end 144 of the base 104 are no longer coplanar and a top surface 202 of the base 104 is partially exposed. When in the closed position, the indicator 140 now extends beyond the front ends 132 and 144 of the cam assembly 128 and the base 104, respectively.

Figure 3:
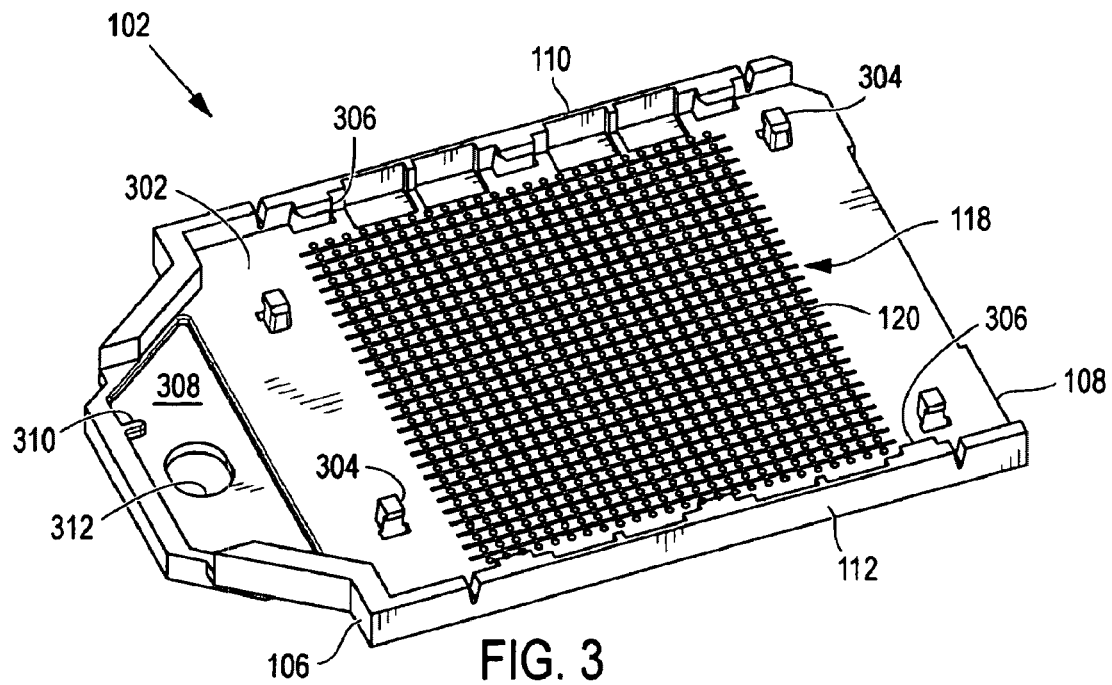
FIG. 3 illustrates a bottom perspective view of a cover for a socket assembly formed in accordance with an embodiment of the present invention.

FIG. 3 illustrates a bottom view of the cover 102. The cover 102 includes a bottom face 302 having retention latches 304 for retaining the cover 102 to the base 104. The sides 110 and 112 also include retention latches 306 for retaining the cover 102 to the base 104. The holes 120 of the PGA 118 extend through the cover 102 to the bottom face 302 of the cover 102. The bottom face 302 includes a cover plate recess 308 proximate the front end 106 of the cover 102. The cover plate recess 308 includes a finger 310 for orientation purposes and a centrally located oblong hole 312 for receiving the cam pin 138 (FIG. 1).

Figure 4:
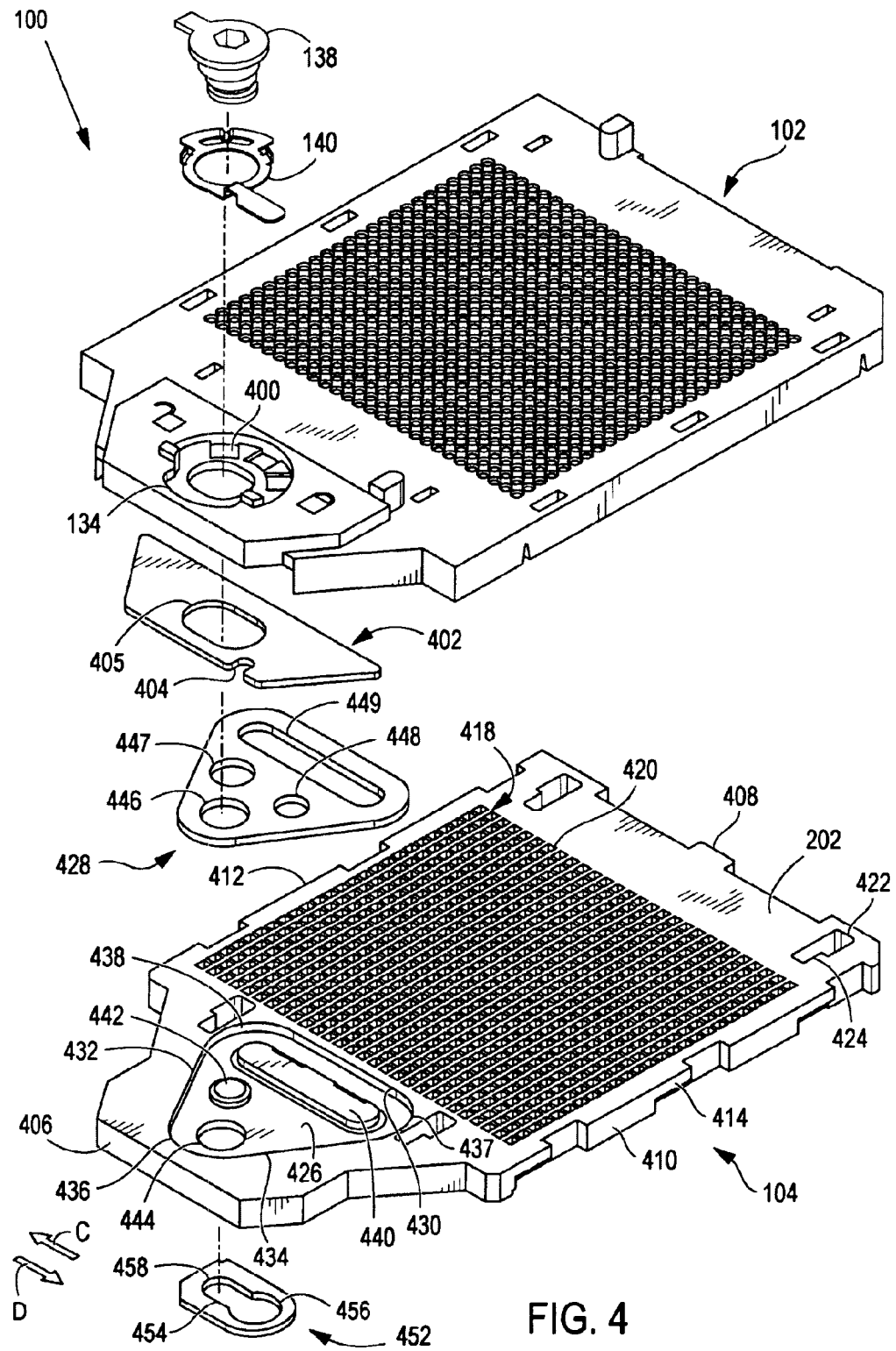
FIG. 4 illustrates an exploded view of a socket assembly formed in accordance with an embodiment of the present invention.

FIG. 4 illustrates an exploded view of the socket assembly 100. The cam pin retention hole 134 includes recesses 400 that are generally square-shaped for restricting movement of the indicator 140. The cover plate recess 308 (FIG. 3) on the bottom face 302 of the cover 102 receives a cover plate 402. The cover plate 402 includes a notch 404 cut in its perimeter to accept the finger 310 of the cover plate recess 308 for orientation purposes. The cover plate 402 also includes a centrally located oblong hole 405 for receiving the cam pin 138. The base 104 includes front and back ends 406 and 408 as well as sides 410 and 412. The sides 410 and 412 include shelves 414 that are slidably received with the retention latches 306 (FIG. 3) on the sides 110 and 112 of the cover 102.

The base 104 includes an array of contact holes 420 that retain contacts. The contact holes 420 are aligned to correspond to the holes 120 that receive the pins of a processor. The top surface 202 also includes windows 422 proximate the front and back ends 406 and 408 and having shelves 424 that are slidably received by the retention latches 304 of the bottom face 302 of the cover 102. The top surface 202 further includes a base plate recess 426 for receiving a plate 428. The base plate recess 426 is triangularly-shaped having a bottom edge 430 and side edges 432 and 434 joined by rounded corners 436-438. The base plate recess 426 includes an oblong knob 440 protruding upward therefrom and extending parallel, and proximate, to the bottom edge 430. The base plate recess 426 also includes a circular knob 442 protruding upward therefrom and positioned intermediately along, and proximate to, the side edge 432. The base plate recess 426 further includes a circular hole 444 positioned proximate to the rounded corner 436 for receiving the cam pin 138.

The plate 428 is triangularly shaped for insertion into the triangularly shaped base plate recess 426. The plate 428 includes different sized holes 446-449. A circular hole 446 receives the cam pin 138 and aligns with the circular hole 444 of the base plate recess 426. A circular hole 447 receives the circular knob 442 of the base plate recess 426 for orientating the plate 428 therein. A circular hole 448 may be included to reduce the weight of the plate 428. An oblong hole 449 receives the oblong knob 440 of the base plate recess 426. The socket assembly 100 includes a locking clip 452 for locking the cam pin 138. The locking clip 452 includes an irregularly shaped hole 454 having rounded ends 456 and 458. The locking clip 452 moves in the directions of arrows C and D to lock and unlock, respectively, the cam pin 138.

Figure 5:
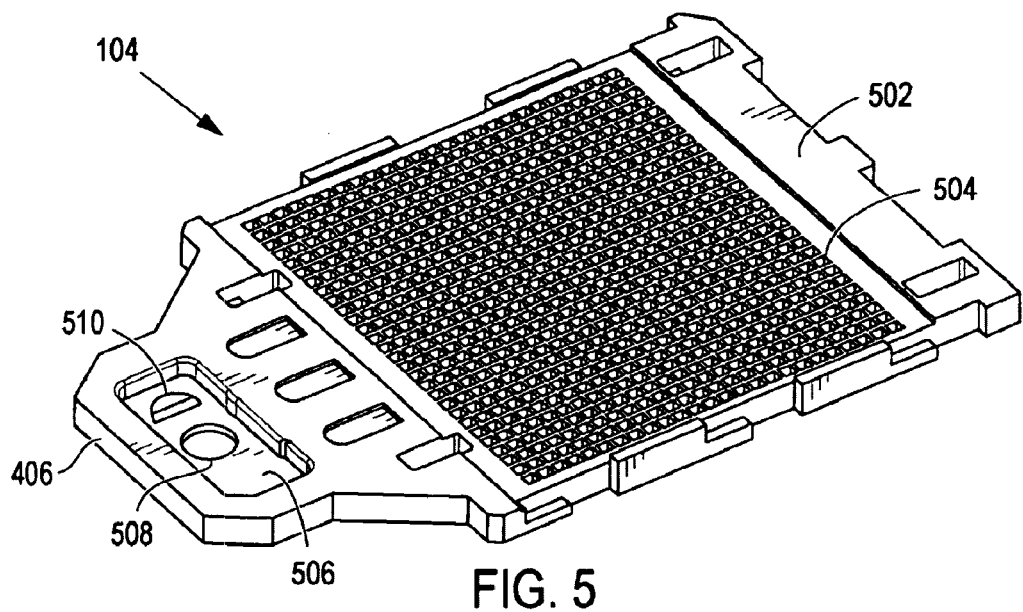
FIG. 5 illustrates a bottom perspective view of a base for a socket assembly formed in accordance with an embodiment of the present invention.

FIG. 5 illustrates a bottom perspective view of the base 104. The base 104 includes a bottom surface 502 having a plurality of solder balls 504 corresponding to the plurality of cavities 420 on the top surface 202 of the base 104. The bottom surface 502 also includes a locking clip recess 506 for receiving the locking clip 452 proximate the front end 406 of the base 104. The locking clip recess 506 includes a circular hole 508 for receiving the cam pin 138. The locking clip recess 506 also includes a semicircular projection 510 that receives the rounded end 456 of the locking clip 452 in order to hold the locking clip 452 locked to the cam pin 138.

Figure 6:
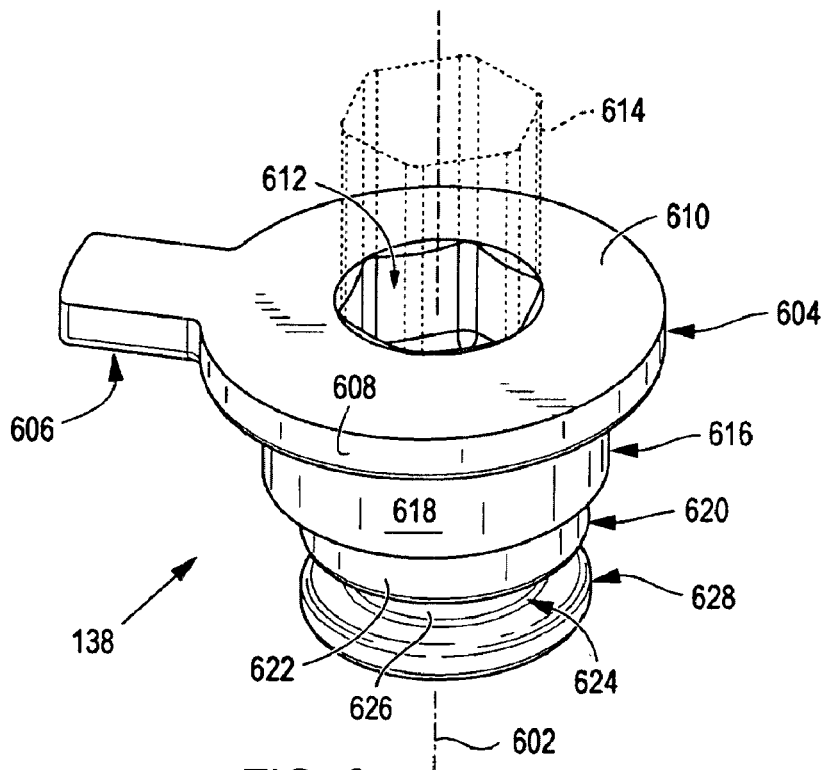
FIG. 6 illustrates a top perspective view of a cam pin formed in accordance with an embodiment of the present invention.

FIG. 6 illustrates the cam pin 138 formed in accordance with an embodiment of the present invention. The cam pin 138 is rotatable around an axis 602 and includes a washer portion 604 positioned at the top of the cam pin 138. The washer portion 604 is generally ring shaped but has a tab 606 extending outward radially from an outer edge 608 of the washer portion 604. The washer portion 604 includes a top surface 610 that has a hexagonal-shaped cavity 612 cut therein and configured to receive a hexagonal wrench 614. The cam pin 138 includes a cover plate lobe 616 of circular shape immediately beneath the washer portion 604. The cover plate lobe 616 includes an outer surface 618 that projects through the indicator 140, the oblong hole 312 of the cover plate recess 308, and the oblong hole 405 of the cover plate 402.

The cam pin 138 includes a base plate lobe 620 of circular shape immediately beneath the cover plate lobe 616. The base plate lobe 620 includes an outer surface 622 that is received by the circular hole 446 of the plate 428 and the circular hole 444 of the base plate recess 426. The cover and base plate lobes 616 and 620 form cylinders that are eccentrically mounted on the cam pin 138 relative to one another.

The cam pin 138 includes a locking rod 624 of circular shape immediately beneath the base plate lobe 620. The locking rod 624 includes an outer surface 626 that is received by the end 458 of the hole 454 on the locking clip 452. The cam pin 138 includes a locking disc 628 of circular shape immediately beneath the locking rod 624. The locking disc 628 is of a larger circular shape than the locking rod 624. The locking disc 628 is initially received through the end 456 of the hole 454 on the locking clip 452 prior to the locking clip 452 being moved in the direction denoted by the arrow C. When the locking clip 452 is moved in the direction denoted by the arrow C, the locking rod 624 is received by the end 458 of the hole 454 on the locking clip 452, thereby locking the locking clip 452 to the cam pin 138.

Figure 7:
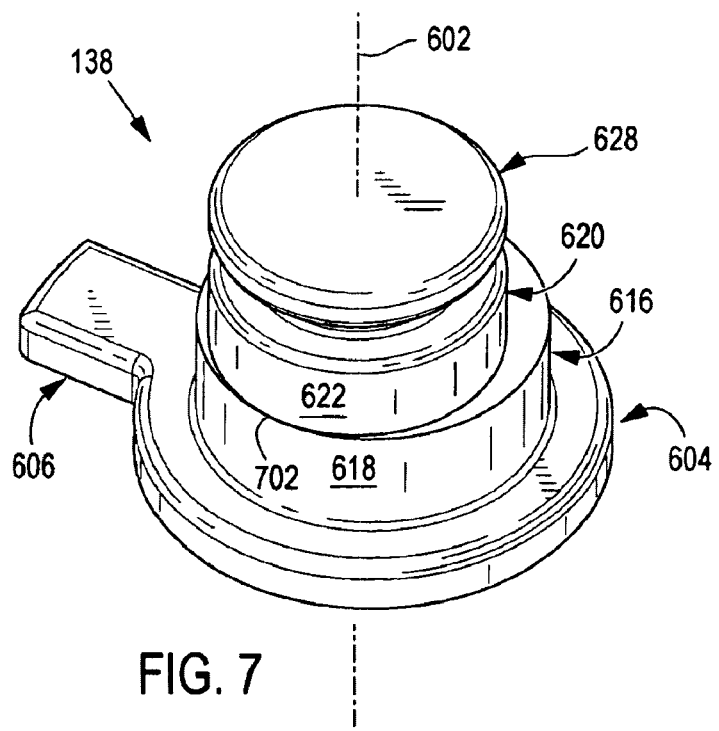
FIG. 7 illustrates a bottom perspective view of a cam pin formed in accordance with an embodiment of the present invention.

FIG. 7 illustrates a bottom view of the cam pin 138 formed in accordance with an embodiment of the present invention. The outer surfaces 618 and 622 of the cover plate lobe 616 and base plate lobe 620, respectively, are tangent to one another at a point 702. Although the outer surfaces 618 and 622 are tangent to one another at a point 702 in the example of FIG. 7, other embodiments may include outer surfaces not tangent to one another.

Figure 8:
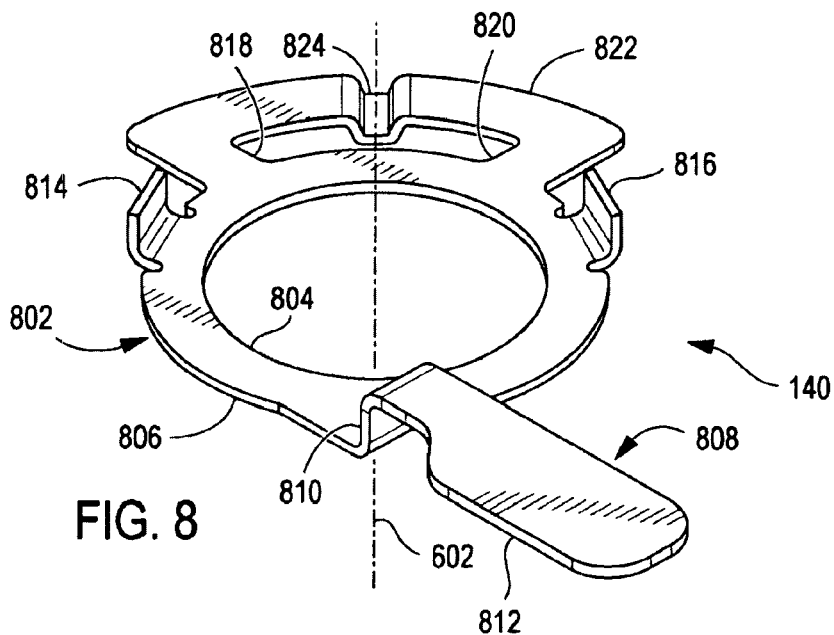
FIG. 8 illustrates a top perspective view of an indicator formed in accordance with an embodiment of the present invention.

FIG. 8 illustrates the indicator 140 formed in accordance with an embodiment of the present invention. The indicator 140 includes a ring shaped body portion 802 that is rotatable around the axis 602. The body portion 802 includes a circular hole 804 that receives the cover plate lobe 616 of the cam pin 138. The body portion 802 includes an outer perimeter 806 generally of circular shape. The outer perimeter 806 includes an arm 808 extending outward at an angle from end 810. The arm 808 includes a visual indicator portion 812. The visual indicator portion 812 is exposed from above the cover 102 at all times, but is only exposed beyond the outside of the front end 132 of the cover 102 when in the closed position. The visual indicator portion 812 is displaced upward from the body portion 802 by the end 810. The outer perimeter 806 includes pivots 814 and 816 projecting upward therefrom for engaging the tab 606 of the cam pin 138. The outer perimeter 806 also includes adjoining sections 818 and 820 that adjoin a ledge 822 to the outer perimeter 806. The ledge 822 includes a buckle 824 protruding downward therefrom. The buckle 824 restricts rotation of the indicator 140 about the axis 602 between the recesses 400 of the cam pin retention hole 134.

The socket assembly 100 is switched between open and closed positions (FIGS. 1 and 2, respectively) by rotating a hexagonal wrench 614 in the hexagonal-shaped cavity 612 of the cam pin 138 around the axis 602. As the cam pin 138 rotates from open to closed positions (FIGS. 1 and 2, respectively), the outer surface 618 of the cover plate lobe 616 pushes against the oblong hole 405 of the cover plate 402 in the direction denoted by the arrow A, thus moving the cover plate 402 in the direction denoted by the arrow A. The cover plate 402, being snugly inserted into the cover plate recess 308, forces the entire cover 102 to move in the direction denoted by the arrow A. While the cover plate 402 and the cover 102 move in the direction denoted by the arrow A, the base 104 remains fixed. Additionally, as the cam pin 138 rotates from open to closed positions (FIGS. 1 and 2, respectively), the tab 606 on the cam pin 138 rotates a first 90 degrees and then engages and rotates the pivot 816 on the indicator 140 a second 90 degrees, causing the indicator 140, and the arm 808 on the indicator 140, to rotate 90 degrees. Thus, in the closed position (FIG. 2), the arm 808 of the indicator 140 extends beyond the front ends 132 and 144 of the cam assembly 128 and the base 104, respectively.

As the cam pin 138 rotates from closed to open positions (FIGS. 2 and 1, respectively), the outer surface 618 of the cover plate lobe 616 pushes against the oblong hole 405 of the cover plate 402 in the direction denoted by the arrow B, thus moving the cover plate 402 in the direction denoted by the arrow B. The cover plate 402, being snugly inserted into the cover plate recess 308, forces the entire cover 102 to move in the direction denoted by the arrow B. While the cover plate 402 and the cover 102 move in the direction denoted by the arrow B, the base 104 remains fixed. Additionally, as the cam pin 138 rotates from closed to open positions (FIGS. 2 and 1, respectively), the tab 606 on the cam pin 138 rotates a first 90 degrees and then engages and rotates the pivot 814 on the indicator 140 a second 90 degrees, causing the indicator 140, and the arm 808 on the indicator 140, to rotate 90 degrees. Thus, in the open position (FIG. 1), the arm 808 of the indicator 140 is perpendicular to and does not extend beyond the front ends 132 and 144 of the cam assembly 128 and the base 104, respectively.

Figure 9:
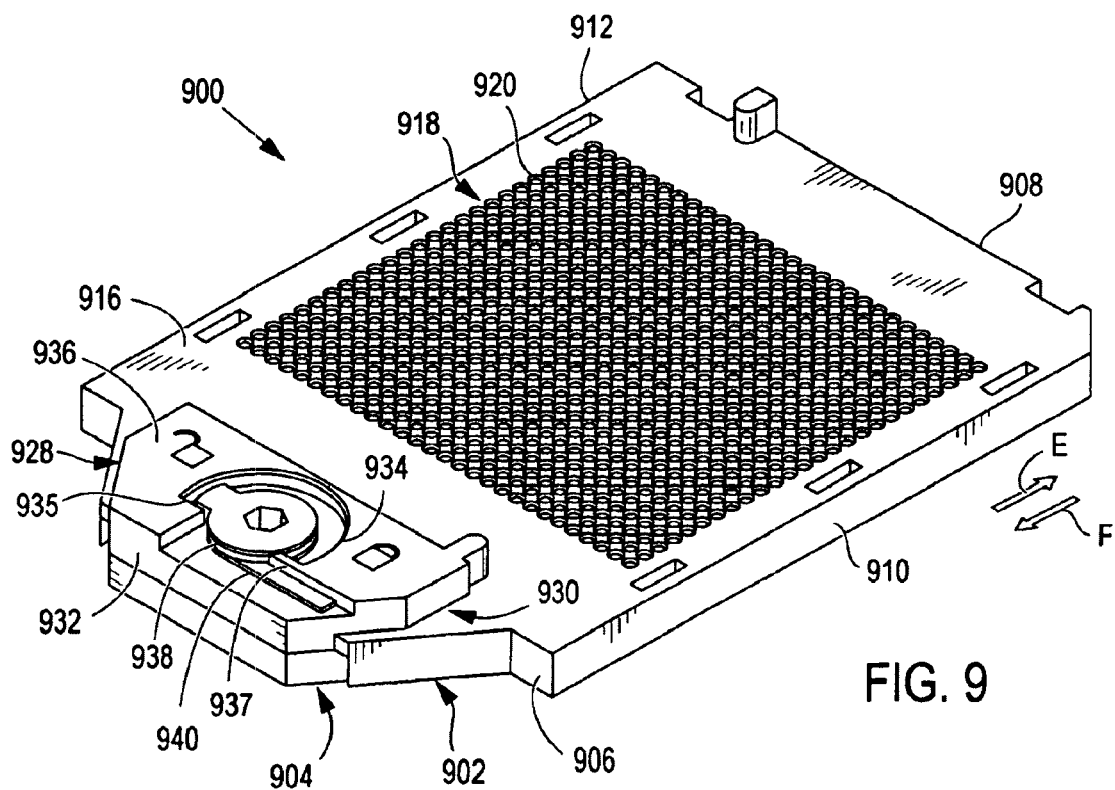
FIG. 9 illustrates top front perspective view of a socket assembly in an open position formed in accordance with an embodiment of the present invention.

FIG. 9 illustrates a zero insertion force (ZIF) pin grid array (PGA) socket assembly 900 in an open position formed in accordance with an embodiment of the present invention. The socket assembly 900 includes a cover 902 and a base 904 that move relative to one another along directions denoted by arrows E and F. The cover 902 includes front and back ends 906 and 908 as well as sides 910 and 912. The cover 902 also includes a top surface 916 that has a PGA 918 having a plurality of holes 920 for receiving pins from a processor (not shown). The cover 902 further includes a cam assembly 928 proximate the front end 906 of the cover 902 and elevated a step 930 from the top surface 916 of the cover 902. The cam assembly 128 includes a front end 932 and a cam pin retention hole 934 cut into a top surface 936 of the cam assembly 928. The cam pin retention hole 934 includes a cam pin 938 and an indicator 940 housed therein and stop walls 935 and 937 for restricting rotation of the cam pin 938. The front end 932 of the cam assembly 928 and a front end 944 of the base 904 are coplanar, and the indicator 940 does not extend beyond the front ends 932 and 944 of the cam assembly 928 and the base 904, respectively.

FIG. 10 illustrates the socket assembly 900 in a closed position formed in accordance with an embodiment of the present invention. The cover 902 and base 904 are shifted so that the front end 932 of the cam assembly 928 and the front end 944 of the base 904 are no longer coplanar and a top surface 1002 of the base 904 is partially exposed. Additionally, the indicator 940 now extends beyond the front ends 932 and 944 of the cam assembly 928 and the base 904, respectively.

FIG. 11 illustrates a bottom view of a cam pin 938 formed in accordance with an embodiment of the present invention. The cam pin 938 is rotatable around an axis 1102 and includes a washer portion 1104 positioned at the top of the cam pin 938. The washer portion 1104 is generally ring shaped but has a tab 1106 extending outward radially from an outer edge 1108 of the washer portion 1104. The tab 1106 includes push surfaces 1110 and 1112.

FIG. 12 illustrates an indicator 940 formed in accordance with an embodiment of the present invention. The indicator 940 includes a ring shaped body section 1202 that is rotatable around the axis 1102. The body section 1202 includes an outer perimeter 1204 generally of circular shape. The outer perimeter 1204 includes an arm 1206 extending outward therefrom and an arcuate notch 1208 cut therein. Ends 1210 and 1212 of the arcuate notch 1208 receive the push surfaces 1110 and 1112, respectively, as the cam pin 938 rotates around the axis 1102 between open and closed positions (FIGS. 9 and 10, respectively).

Referring to the FIGS. 9–12 generally, the socket assembly 900 is switched between open and closed positions (FIGS. 9 and 10, respectively) by rotating the cam pin 938 around the axis 1102. To switch the socket assembly 900 from the open to the closed position (FIGS. 9 and 10, respectively), the cam pin must be rotated 180 degrees so that the tab 1106, which abuts the stop wall 935 in the open position (FIG. 9), abuts the stop wall 937. As the tab 1106 rotates from open to closed positions (FIGS. 9 and 10, respectively), the tab 1106 rotates a first 90 degrees, and then the push surface 1110 on the tab 1106 engages the end 1210 of the arcuate notch 1208 on the indicator 940 and rotates the indicator 940 a second 90 degrees so that the arm 1206 of the indicator 940 extends beyond the front ends 932 and 944 of the cam assembly 928 and the base 904, respectively. To switch the socket assembly 900 from the closed to open position (FIGS. 10 and 9, respectively), the cam pin must be rotated 180 degrees so that the tab 1106, which abuts the stop wall 937 in the closed position (FIG. 10), abuts the stop wall 935. As the tab 1106 rotates from closed to open positions (FIGS. 10 and 9, respectively), the tab 1106 rotates a first 90 degrees, and then the push surface 1112 on the tab 1106 engages the end 1212 of the arcuate notch 1208 on the indicator 940 and rotates the indicator 940 a second 90 degrees so that the arm 1206 of the indicator 940 extends parallel to, but not beyond, the front ends 932 and 944 of the cam assembly 928 and the base 904, respectively.

Figure 13:
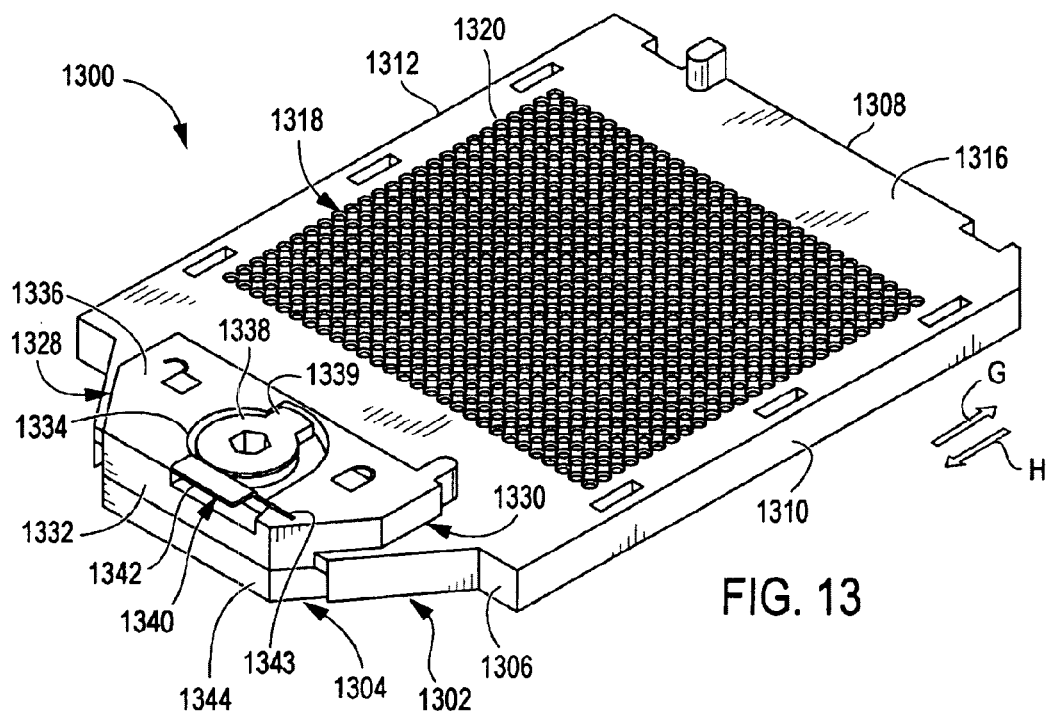
FIG. 13 illustrates top front perspective view of a socket assembly in an open position formed in accordance with an embodiment of the present invention.

FIG. 13 illustrates a zero insertion force (ZIF) pin grid array (PGA) socket assembly 1300 in an open position formed in accordance with an embodiment of the present invention. The socket assembly 1300 includes a cover 1302 and a base 1304 that move relative to one another along directions denoted by arrows G and H. The cover 1302 includes front and back ends 1306 and 1308 as well as sides 1310 and 1312. The cover 1302 also includes a top surface 1316 that has a PGA 1318 having a plurality of holes 1320 for receiving pins from a processor (not shown). The cover 1302 further includes a cam assembly 1328 proximate the front end 1306 of the cover 1302 and elevated a step 1330 from the top surface 1316 of the cover 1302. The cam assembly 128 includes a front end 1332 and a cam pin retention hole 1334 cut into a top surface 1336 of the cam assembly 1328. The cam pin retention hole 1334 includes a cam pin 1338 and an indicator 1340 housed therein. The indicator 1340 is comprised of an arm 1342 and a tab 1339. The tab 1339 is formed with the cam pin 1338 to engage the arm 1342. The arm 1342 is joined through a flexible member 1343 to the top surface 1336 of the cam assembly 1328. The front end 1332 of the cam assembly 1328 and a front end 1344 of the base 1304 are coplanar, and the arm 1342 of the indicator 1340 is parallel to, but does not extend beyond, the front ends 1332 and 1344 of the cam assembly 1328 and the base 1304, respectively. The tab 1339 is rotated by the cam pin 1338 until engaging, and deflecting outward, the arm 1342.

Figure 14:
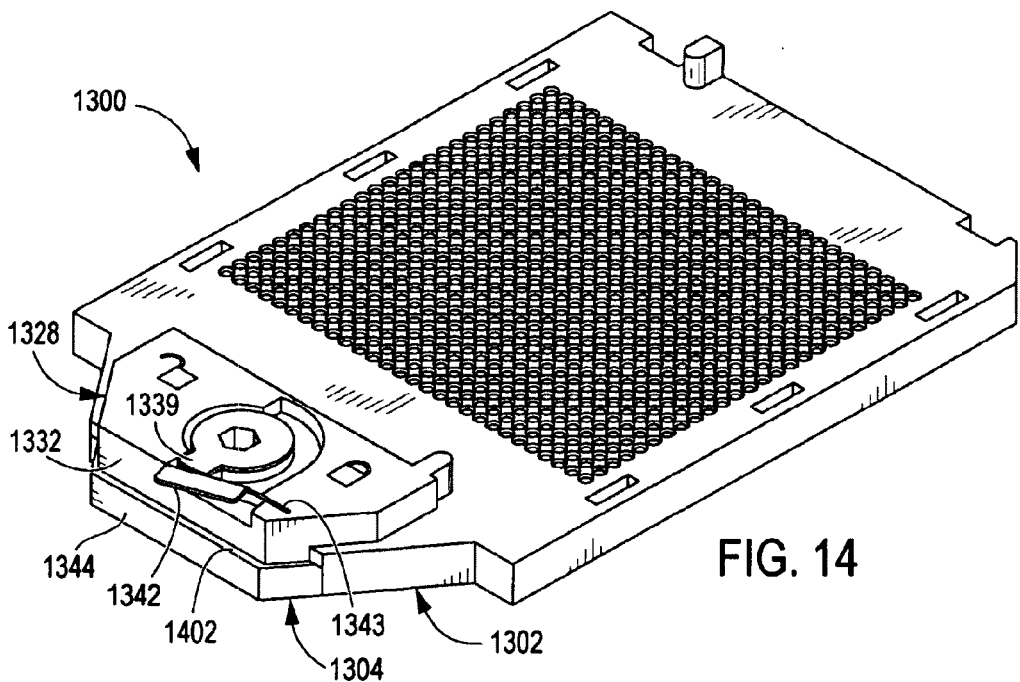
FIG. 14 illustrates top front perspective view of a socket assembly in a closed position formed in accordance with an embodiment of the present invention.

FIG. 14 illustrates the socket assembly 1300 in a closed position formed in accordance with an embodiment of the present invention. The cover 1302 and base 1304 are shifted so that the front end 1332 of the cam assembly 1328 and the front end 1344 of the base 1304 are no longer coplanar and a top surface 1402 of the base 1304 is partially exposed. Additionally, the tab 1339 on the cam pin 1338 pushes against the arm 1342 of the indicator 1340 so that the flexible member 1343 of the indicator 1340 flexes allowing the arm 1342 to extend beyond the front ends 1332 and 1344 of the cam assembly 1328 and the base 1304, respectively.

While certain embodiments of the present invention employ socket assemblies having indicators located on top of the covers, other embodiments may include socket assemblies having indicators located between the cover and base. For example only, the front end of the cover could have a slot formed therein for housing the indicator between the cover and base. The indicator could rotate about a cam pin, or, optionally, the indicator could rotate about a circular flange provided on top of the base or on bottom of the cover. A tab on the cam pin, or on the circular flange, could engage pivot portions on the indicator, thereby rotating the indicator.

Optionally, the front end of the cover can have an arcuate slot formed therein for housing the indicator. The indicator could have pivots extending up through the slot for engaging a cam tab.

While certain embodiments of the present invention employ socket assemblies having cam assemblies to move the socket assembles between open and closed positions, other embodiments may include socket assemblies having other means for moving the socket assembles between open and closed positions such as screws, levers and the like.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed, but that the invention will include all embodiments falling within the scope of the appended claims.

What is claimed is:

1. An electrical socket comprising;
a base containing cavities arranged in a contact receiving pattern;
a cover slidably assembled to said base, said cover including openings configured to align with said cavities to accept pins an an electrical package with substantially no insertion force when said base and cover are in an open position;
a cam assembly moving said cover with respect to said base between said open position and a closed position, said cam assembly including a drive element; and
an indicator coupled to said cam assembly, said indicator being moved by said cam assembly between first and second indicator positions relative to said cover and said base, each of said first and second indicator positions visually identifying one of maid open and closed positions, respectively,
wherein said cam assembly and said indicator move through different first and second ranges of rotation, respectively, as said cover moves between said open and closed positions.

2. The electrical connector socket of claim 1, wherein one of said cover and said base comprises an end, and a portion of said indicator projects beyond said end when said indicator is in said second indicator position to visually identify that said cover is in said closed position.

3. The electrical connector socket of claim 1, wherein said first range of rotation is greater than said second range of rotation.

4. The electrical connector socket of claim 1, wherein said cam assembly moves through a 180 degree range of rotation and said indicator moves through a 90 degree range of rotation as said cover moves between said open and closed positions.

5. The electrical connector socket of claim 1, wherein said cam assembly includes a circular base portion rotationally held in a circular hole in said base and includes a cam portion rotatably held in an oval hole in said cover.

6. The electrical connector socket of claim 1, wherein said indicator includes an arm extending outward from said cam assembly, said cam assembly driving said arm between said first and second indicator positions.

7. The electrical connector socket of claim 1, wherein said cam assembly includes a body and a tab extending outward from said body, said body and said tab being rotatable through a camming range representing a range of rotation through which said cam assembly moves, said tab moving through a first portion of said camming range before engaging said indicator and, after engaging said indicator, driving said indicator through a second portion of said camming range.

8. The electrical connector socket of claim 1, wherein said cam assembly includes a body and a tab extending outward from said body, said body and said tab being rotatable through a camming range representing a range of rotation through which said cam assembly moves, said tab engaging and driving said indicator through a first portion of said camming range after which said tab disengages said indicator and moves through a second portion of said camming range without moving said indicator.

9. The electrical connector socket of claim 1, wherein said cam assembly includes a body and a tab extending outward from said body, said body and tab being rotatable through a camming range representing a range of rotation through which said cam assembly moves, said tab engaging said indicator at one of first and second sites on said indicator when said tab is located at an intermediate point in said camming range.

10. The electrical connector socket of claim 1, wherein said indicator includes a circular body section rotatably held on said cam assembly, said circular body section including fingers and an arm thereon, said cam assembly intermittently engaging said fingers, said arm extending outward from said circular body section.

11. The electrical connector socket of claim 1, wherein said indicator is mounted on said cover, said indicator having an indicator beam biased inward toward said cam assembly in said first indicator position and flexed outward by said cam assembly to said second indicator position.

12. The electrical connector socket of claim 1, wherein said indicator includes a ring shaped body section with an arcuate notch formed in an outer perimeter thereof, said cam assembly having a tab moving along said arcuate notch.

13. The electrical connector socket of claim 1, wherein said cam assembly includes means for driving said indicator between said first and second indicator positions.

14. The electrical connector socket of claim 1, wherein said indicator includes means for engaging said cam assembly to be driven between said first and second indicator positions.

15. An electrical connector socket comprising:
a base containing cavities arranged in a contact receiving pattern;
a cover slidably assembled to said base, said cover including openings configured to align with said cavities to accept pins on an electrical package when said base and said cover are in an open position relative to each other;
moving means coupled between said cover for moving said base and said cover between said open position and a closed position; and
indicating means actuated by said moving means for visually indicating when said base and said cover are in said open and said closed positions,
wherein said indicating means includes a circular body section rotatably held on said moving means, said circular body section including fingers and an arm thereon, said arm extending outward from said circular body section.

16. The electrical connector socket of claim 15, wherein said arm extends beyond an end of one of said cover and said base when said base and said cover are in said closed position.

17. The electrical connector socket of claim 15, wherein said moving means and said indicating means move through different first and second ranges of rotation as said cover and said base move between said open and said closed positions.

18. The electrical connector socket of claim 15, wherein said moving means and said indicating means move through different first and second ranges of rotation as said cover and said base move between said open and said closed positions, said first range of rotation being greater than said second range of rotation.

19. The electrical connector socket of claim 15, wherein said moving means moves through a 180 degree range of rotation and said indicator means moves through a 90 degree range of rotation as said cover and said base move between said open and said closed positions.

20. The electrical connector socket of claim 15, wherein said moving means drives said arm between first and second indicator positions corresponding to said open and closed positions.

21. The electrical connector socket of claim 15, wherein said moving means includes a body and a tab extending outward from said body, said body and said tab being rotatable through a camming range, said tab moving through a first portion of said camming range before engaging said indicating means and, after engaging said indicating means, moving said indicating means through a second portion of said camming range.

22. The electrical connector socket of claim 15, wherein said moving means includes a body and a tab extending outward from said body, said body and said tab being rotatable through a camming range, said tab engaging said indicating means at one of first and second sites on said indicating means at an intermediate point in said camming range.

23. The electrical connector socket of claim 15, wherein said indicating means is held on said cover, said indicating means having an indicator beam biased toward said moving means in a first indicator position and flexed outward by said moving means to a second indicator position.

24. An electrical connector socket comprising:

a base containing cavities arranged in a contact receiving pattern;

a cover slidably assembled to said base, said cover including openings configured to align with said cavities to accept pins on an electrical package with substantially no insertion force when said base and cover are in an open position relative to each other;

a rotatable cam assembly mounted to said base and said cover for moving said base and said cover between said open position and a closed position, said cam assembly including a drive element configured to be engaged to rotate said cam assembly in order to move said base and said cover between said open and closed positions; and a rotatable indicator mounted to at least one of said cam assembly, said base and said cover, said indicator moving with said cam assembly and positioned to extend outward from said socket when said cover and said base are in one of said open and closed positions, thereby visually indicating an open or closed state of the socket.

25. The electrical connector socket of claim 24, wherein said indicator is pivotally mounted about a circular portion of at least one of said cam assembly, said base and said cover.

26. The electrical connector socket of claim 24, wherein said indicator includes in arm pivotal between first and second indicator positions and further wherein said arm extends along an axis forming an acute angle to a transverse axis of said cover.

27. The electrical connector socket of claim 24, wherein said indicator includes a hole, and said indicator is pivotally mounted through said hole to one of said cam assembly, said cover and said base to define a pivotal motion of said indicator.

28. The electrical connector socket of claim 24, wherein said indicator includes a driver surface engaged by a driving portion on one of said cam assembly, said cover and said base, said driving portion engaging said driver surface when said cover and said base move between said open and closed positions to move said indicator between first and second indicator positions.

29. The electrical connector socket of claim 24, wherein said indicator includes an actuation portion engaged and actuated by one of said cam assembly, said cover and said base to move said indicator to one of first and second indicator positions.

* * * * *